United States Patent
Panchula (10) Patent No.: US 7,224,601 B2
(45) Date of Patent: May 29, 2007

(54) OSCILLATING-FIELD ASSISTED SPIN TORQUE SWITCHING OF A MAGNETIC TUNNEL JUNCTION MEMORY ELEMENT

(75) Inventor: Alex Panchula, San Carlos, CA (US)

(73) Assignee: Grandis Inc., Milpitas, CA (US)

( * ) Notice: Subject to any disclaimer, the term of this patent is extended or adjusted under 35 U.S.C. 154(b) by 0 days.

(21) Appl. No.: 11/271,208

(22) Filed: Nov. 9, 2005

(65) Prior Publication Data
US 2007/0047294 A1 Mar. 1, 2007

Related U.S. Application Data

(60) Provisional application No. 60/711,642, filed on Aug. 25, 2005.

(51) Int. Cl.
G11C 11/00 (2006.01)
G11C 11/14 (2006.01)

(52) U.S. Cl. .................. 365/158; 365/171; 365/173

(58) Field of Classification Search ............ 365/158, 365/171, 173
See application file for complete search history.

(56) References Cited

U.S. PATENT DOCUMENTS

| | | | |
|---|---|---|---|
| 5,695,864 A | 12/1997 | Slonczewski | |
| 6,137,662 A | 10/2000 | Huai et al. | |
| 6,175,476 B1 | 1/2001 | Huai et al. | |
| 6,201,673 B1 | 3/2001 | Rottmayer et al. | |
| 6,222,707 B1 | 4/2001 | Huai et al. | |
| 6,351,355 B1 | 2/2002 | Min et al. | |
| 6,351,409 B1 | 2/2002 | Rizzo et al. | |
| 6,381,105 B1 | 4/2002 | Huai et al. | |
| 6,447,935 B1 | 9/2002 | Zhang et al. | |
| 6,545,906 B1 | 4/2003 | Savtchenko et al. | |
| 6,603,677 B2 | 8/2003 | Redon et al. | |
| 6,687,098 B1 | 2/2004 | Huai | |
| 6,714,444 B2 | 3/2004 | Huai et al. | |
| 6,771,534 B2 * | 8/2004 | Stipe | 365/158 |
| 6,791,868 B2 * | 9/2004 | Gider et al. | 365/158 |
| 6,829,161 B2 | 12/2004 | Huai et al. | |
| 6,838,740 B2 | 1/2005 | Huai et al. | |
| 6,847,547 B2 | 1/2005 | Albert et al. | |
| 6,888,704 B1 | 5/2005 | Diao et al. | |
| 6,888,742 B1 | 5/2005 | Nguyen et al. | |
| 6,920,063 B2 | 7/2005 | Huai et al. | |
| 6,933,155 B2 | 8/2005 | Albert et al. | |

(Continued)

FOREIGN PATENT DOCUMENTS

JP 2006-093432 4/2006

OTHER PUBLICATIONS

Slonczewski, et al., "Current-driven excitation of magnetic multilayers", *Journal of Magnetism and Magnetic Materials*, vol. 159, pp. L1-L7, 1996.

(Continued)

*Primary Examiner*—Trong Phan
(74) *Attorney, Agent, or Firm*—Fish & Richardson P.C.

(57) ABSTRACT

Devices and techniques for applying a resonant action by an applied oscillating magnetic field to a magnetic tunnel junction (MTJ) and an action of an applied DC current across the MTJ to effectuate a switching of the MTJ when writing data to the MTJ.

23 Claims, 5 Drawing Sheets

U.S. PATENT DOCUMENTS

| | | | |
|---|---|---|---|
| 6,958,927 B1 | 10/2005 | Nguyen et al. | |
| 6,967,863 B2 | 11/2005 | Huai | |
| 6,979,586 B2 | 12/2005 | Guo et al. | |
| 6,985,385 B2 | 1/2006 | Nguyen et al. | |
| 6,989,972 B1 | 1/2006 | Stoev et al. | |
| 6,992,359 B2 | 1/2006 | Nguyen et al. | |
| 7,006,375 B2 * | 2/2006 | Covington | 365/173 |
| 7,009,877 B1 * | 3/2006 | Huai et al. | 365/171 |
| 7,027,268 B1 | 4/2006 | Zhu et al. | |
| 7,057,921 B2 | 6/2006 | Valet | |
| 7,088,609 B2 * | 8/2006 | Valet | 365/158 |
| 7,098,494 B2 | 8/2006 | Pakala et al. | |
| 7,105,372 B2 | 9/2006 | Min et al. | |
| 7,106,624 B2 | 9/2006 | Huai et al. | |
| 7,110,287 B2 | 9/2006 | Huai et al. | |
| 2004/0130936 A1 | 7/2004 | Nguyen et al. | |
| 2004/0136231 A1 | 7/2004 | Huai et al. | |
| 2004/0170055 A1 | 9/2004 | Albert et al. | |
| 2004/0235201 A1 | 11/2004 | Albert et al. | |
| 2005/0041342 A1 | 2/2005 | Huai et al. | |
| 2005/0063222 A1 | 3/2005 | Huai et al. | |
| 2005/0106810 A1 | 5/2005 | Pakala et al. | |
| 2005/0136600 A1 | 6/2005 | Huai | |
| 2005/0184839 A1 | 8/2005 | Nguyen et al. | |
| 2005/0237787 A1 | 10/2005 | Huai et al. | |
| 2006/0018057 A1 | 1/2006 | Huai et al | |
| 2006/0049472 A1 | 3/2006 | Diao et al. | |
| 2006/0081953 A1 | 4/2006 | Nguyen et al. | |
| 2006/0102969 A1 | 5/2006 | Huai et al. | |
| 2006/0114618 A1 | 6/2006 | Masanori et al. | |
| 2006/0128038 A1 | 6/2006 | Pakala et al. | |
| 2006/0141640 A1 | 6/2006 | Huai et al. | |
| 2006/0192237 A1 | 8/2006 | Huai | |
| 2006/0221676 A1 | 10/2006 | Qian et al. | |

OTHER PUBLICATIONS

Berger, "Emission of spin waves by a magnetic multilayer traversed by a current", *Physical Review B,* vol. 54, No. 13, pp. 9353-9358, Oct. 1, 1996.

Albert, et al., "Spin-polarized current switching of a Co thin film nanomagnet", *Applied Physics Letters,* vol. 77, No. 23, pp. 3809-3811, Dec. 4, 2000.

Doi, et al., "Magnetism of $Co_{1-x}Fe_x$-NOL in Specular Spin-Valves", *IEEE Transactions on Magnetics,* vol. 40, No. 4, pp. 2263-2265, Jul. 2004.

Zhang, et al., "40% tunneling magnetoresistance after anneal at 380 C for tunnel junctions with iron-oxide interface layers", *Journal of Applied Physics,* vol. 89, No. 11, pp. 6665-6667, Jun. 1, 2001.

Devolder, T. et al., "Instability threshold versus switching threshold in spin-transfer-induced magnetization switching", *Physical Review* B71, 184401-1-184401-6 (2005).

Mancoff, F.B. et al., "Phase-locking in double-point-contact spin-transfer devices", *Nature,* vol. 437:393-395 (2005).

Sharrock, M.P. et al., "Kinetic Effects in Coercivity Measurements", *IEEE Transactions on Magnetics,* Vol. Mag-17, No. 6:3020-3022 (1981).

Thirion, C. et al., "Switching of magnetization by nonlinear resonance studied in single nanoparticles", Nature Publishing Group, www.nature.com/naturematerials, vol. 2, 524-527 (2003).

Xi, Haiwen et al., "Spin-current effect on ferromagnetic resonance in patterned magnetic thin film structures", *J of Applied Physics 97,* 033904 (2005).

Tulapurkar, et al., "Subnanosecond magnetization reversal in magnetic nanopillars by spin angular momentum transfer", *Applied Physics Letters,* vol. 85, No. 22, pp. 5358-5360, Nov. 29, 2004.

* cited by examiner

OSCILLATING-FIELD ASSISTED SPIN TORQUE SWITCHING OF A MAGNETIC TUNNEL JUNCTION MEMORY ELEMENT

This application claims the benefit of U.S. Provisional Application No. 60/711,642 entitled HIGH FREQUENCY ASSISTED SPIN TORQUE SWITCHING OF A MAGNETIC TUNNEL JUNCTION MEMORY ELEMENT" and filed Aug. 25, 2005.

BACKGROUND

This application relates to magnetic devices having magnetic tunnel junctions such as magnetic memory devices.

Figure 1:
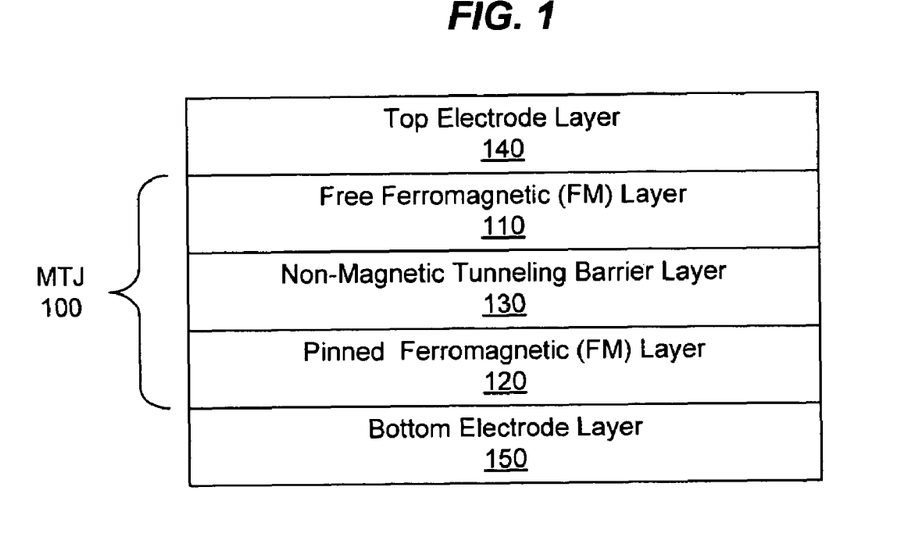
FIG. 1 shows layers of an exemplary magnetic tunnel junction.

A magnetic tunnel junction (MTJ) cell includes two magnetic electrode layers separated by a thin insulating layer known as a tunnel barrier. FIG. 1 shows one example of such an MTJ 100 where each magnetic layer 110 or 120 is in contact with an electrode layer 140 or 150. The electrode layers 140 and 150 electrically connect the magnetic layers 110 and 120 to a control circuit. The resistance across the MTJ 100 is determined by the relative orientation of the magnetization vectors of the magnetic layers 110 and 120. The magnetic layers 110 and 120 may be made of ferromagnetic (FM) alloys such as Fe, Co, Ni and the insulating barrier 130 may be made of an insulator material such as $Al_2O_3$ and MgO. Other suitable materials may also be used. The magnetization direction of one magnetic layer 120 of the MTJ 100 is pinned in a predetermined direction while the magnetization direction of other magnetic layer 110 is free to rotate under the influence of an external magnetic field or spin torque and is frequently referred to as a "free layer." Pinning of the magnetic layer 110 of the two magnetic layers may be achieved through, e.g., the use of exchange bias with an antiferromagnetically ordered material such as PtMn, IrMn and others.

Such an MTJ cell may be used to construct a memory device such as a magnetic random access memory (MRAM). A MRAM may include multiple MTJ cells where a bit is stored in an MTJ by changing the relative magnetization state of the free magnetic layer with respect to the pinned magnetic layer. The stored bit can be read out by measuring the resistance of the cell which changes with the magnetization direction of the free layer relative to the pinned magnetic layer. In order for such an MRAM to have the characteristics of a non-volatile random access memory, the free layer must exhibit thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Various field switched MRAM devices use multiple or an array of magnetic memory cells and digit lines and bit lines to produce magnetic fields for addressing the magnetic memory cells. Each magnetic memory cell includes an MTJ, an isolation transistor, and a bit line and is physically located at the intersection of the digit and bit lines. The switching of the free layer occurs when DC write currents are applied to the bit and the digit lines. The resulting magnetic field at each memory cell, summed at the intersection of the current carrying lines, is set to be sufficient to rotate the free magnetic layer in the MTJ. The switching behavior can be described by the Stoner-Wohlfarth model of coherent rotation. See, E. C. Stoner and E. P. A. Wohlfarth, Phil. Trans. R. Soc. Lon. A 240 599 (1948).

Figure 2:
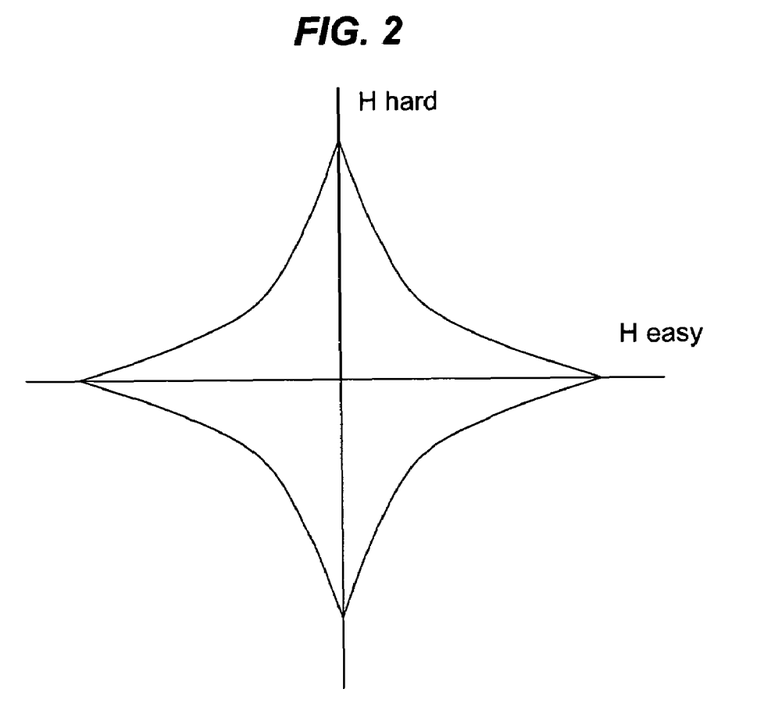
FIG. 2 shows the asteroid curve for a MTJ which may be used for a field-switched MRAM.

FIG. 2 shows an example of the magnetic field properties of an MTJ for the switching and non-switching magnetic field phase space which is defined by an astroid curve along the hard and soft axes (labeled as "H hard" and "H easy") of the free layer. When the applied magnetic field lies outside of the astroid curve, the bit is unstable and can switch. When the applied magnetic field lies inside the astroid curve, the in-plane magnetic coercivity of the free layer dominates and the magnetization direction of the free layer does not change with the applied magnetic field. However, distributions of in-plane anisotropy lead to variations in the astroid curve of the MTJ and such variations create a much smaller area of magnetic field phase space available to completely switch all the bits in the array without the unwanted switching the half-selected bit in the array.

Figure 3:
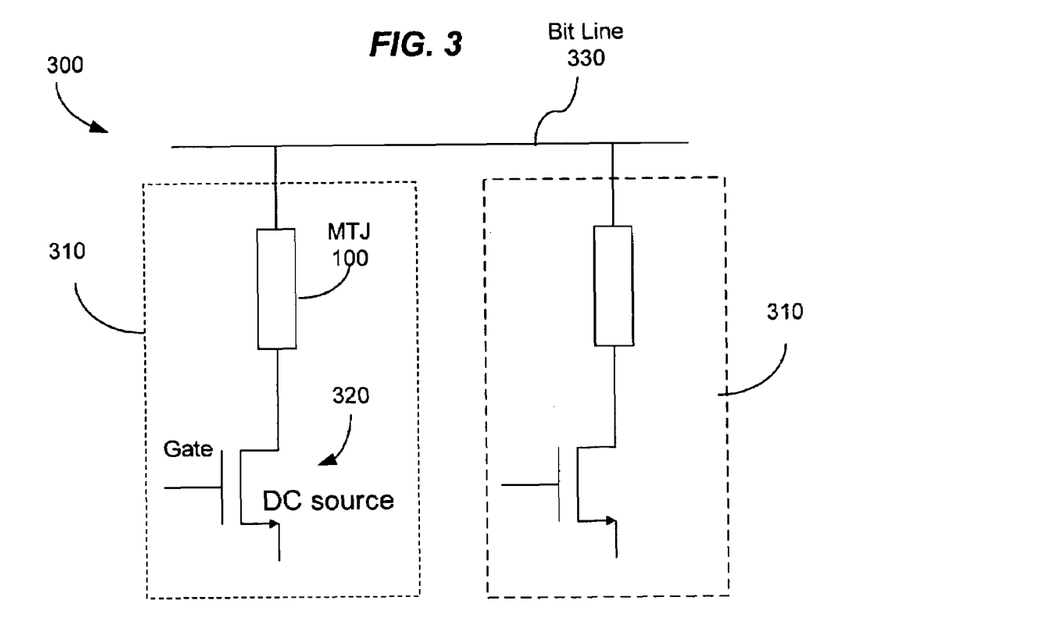
FIG. 3 shows the 1T-1MTJ architecture for spin transfer switching.

FIG. 3 shows an example of a spin-transfer switched MRAM device 300 having an array of memory cells 310 where an MTJ 100 in each cell 310 is connected to an isolation/write transistor 320 and a bit line 330. Switching via spin-transfer occurs when a current, passing through a magnetic layer of the magnetic tunnel junction 100, becomes spin polarized and imparts a spin torque on the free layer of the MTJ. When a sufficient spin torque is applied to the free layer, the magnetization of the free layer can be switched between two opposite directions and accordingly the MTJ can be switched between the parallel and antiparallel states depending on the direction of the DC current. The isolation/write transistor 320 is connected to a DC source and controls the direction and magnitude of the DC current flowing through the MTJ 100 from the DC source. This control may be achieved by the relative voltages on the gate, source and drain of the transistor 320.

Such a spin transfer MRAM generally does not suffer from the half-select problem because switching occurs when the isolation/write transistor 320 is activated and a sufficient spin-polarized current is passed through the MTJ. In this manner, a single cell can be selected without disturbing any other cell in the array. See, e.g., U.S. Pat. No. 5,695,864 to Slonczewski.

SUMMARY

This application includes devices and techniques that use a joined operation of a resonant action by an applied oscillating magnetic field to a MTJ and an action of an applied DC current across the MTJ to effectuate a switching of the MTJ when writing data to the MTJ. Each of two switching mechanisms alone is controlled to provide only the half selection of the MTJ without switching. Implementations of this joined switching by two mechanisms may be used to achieve, among others, high areal cell density and reduced cell cross talk in MRAM array devices.

In one implementation, for example, a magnetic memory device is described to include a memory cell comprising a magnetic tunnel junction which comprises a free magnetic layer, a pinned magnetic layer and a spacer layer which is nonmagnetic and located between the pinned magnetic layer and the free magnetic layer; a mechanism to apply an AC current to produce an oscillating magnetic field at an oscillating frequency equal to or in resonance with a magnetic resonance frequency of the free magnetic layer and to magnetically couple the oscillating magnetic field to the free magnetic layer in the memory cell; and a mechanism to apply a DC current across the magnetic tunnel junction of the memory cell to cause a spin transfer torque in the free magnetic layer.

In another implementation, a method for operating a memory cell comprising a magnetic tunnel junction is described. In this method, an AC current is applied to produce an oscillating field at an oscillating frequency equal to or in resonance with a magnetic resonance frequency of a free magnetic layer of the magnetic tunnel junction to magnetically couple the oscillating field to the free magnetic layer. A DC current is also applied across the magnetic tunnel junction to cause a spin transfer torque in the free magnetic layer. The AC and DC currents are controlled to switch a magnetic orientation of the free magnetic layer.

These and other implementations and variations are described in detail in the attached drawings, the detailed description and the claims.

DETAILED DESCRIPTION

The spin-transfer switched MRAM device 300 in FIG. 3 uses a single write transistor 320 for each MTJ cell 310. This design is known as "1T-1MTJ" architecture. One limitation of this design is that the area of the chip occupied by each memory unit or cell 310 is limited by the size of the isolation/write transistor 320. The transistor 320 in each spin-transfer MRAM cell 320 must source a sufficient DC current to effectuate the current switching of the free layer in the MTJ 100 via the spin transfer. The switching threshold DC current under the spin transfer is greater than the DC current used to read the cell in a field-switched MRAM cell whose switching is achieved by an external magnetic field applied to the cell. As such, the size of the transistor 320 in the spin-transfer MRAM cell 310 is usually larger in size than a transistor used in a field switched MRAM cell when both transistors are constructed with the same or similar materials and have the same or similar designs. Because of this difference in the transistor sizes, the size of a spin transfer MRAM cell is dictated by the size of the transistor and can be larger than the size of a field-switched MRAM cell. Although capable of solving the half-select problem encountered in field-switched MRAM cells, the spin transfer MRAM cells can be limited in their applications to high density storage due to the above requirement on the transistor size.

This application describes circuit designs and control methods for MTJ MRAM cells based on a joined operation of an AC writing current and spin-angular-momentum transfer or spin transfer caused by a DC current flowing across the junction. Due to the contribution to the switching from the AC writing current, the magnitude of the DC current for switching the free layer in the MTJ can be reduced from the magnitude required for spin transfer only MRAM cell in FIG. 3. This reduced DC current leads to a smaller isolation/write transistor in each MRAM cell and thus reduces the size of the MRAM cell for high density storage applications. In addition, the joined operation of an AC writing current and spin-angular-momentum transfer or spin transfer allows for selection of a single MRAM cell without disturbing any other cell in the array. For example, the MRAM can be programmed through the use of resonant oscillating magnetic fields produced by AC writing currents in nearby conductors combined with spin-transfer. The frequency of the field is tuned to the resonant frequency of the free layer in the magnetic cell to achieve low power writing and high density arrays.

Figure 4:
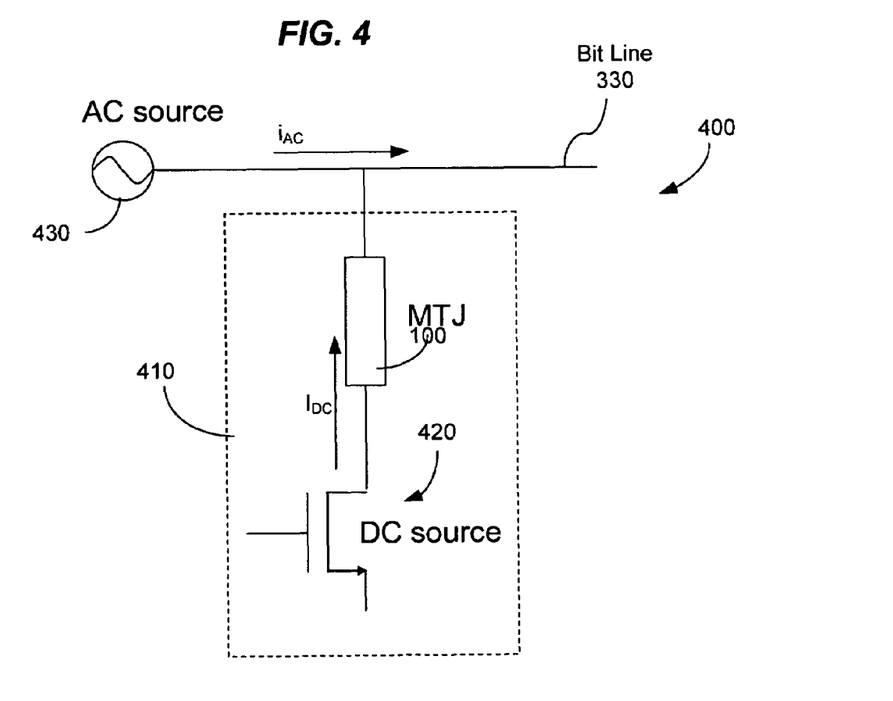
FIG. 4 shows the 1T-1MTJ architecture for RF assisted spin transfer switching.

FIG. 4 illustrates one example of a memory device 400 that implements the joined switching operation of an AC writing current and spin-angular-momentum transfer or spin transfer caused by a DC current flowing across the junction. Similar to the MTJ cell 310 in FIG. 3, a MTJ cell 410 includes an MTJ 100 and an isolation transistor 420 connected to the MTJ cell 420 to source a DC current to the MTJ 100. An AC current source 430 is coupled to the bit line 330 for the MTJ cell 410 to supply an AC writing current $i_{AC}$ to the bit line 330. The device 400 is designed to confine the AC writing current $i_{AC}$ in the bit line 330 without going through the cell 410, i.e., the MTJ 100 and the transistor 420. The AC writing current $i_{AC}$ produces an oscillating magnetic field which interacts with the free layer in the MTJ 100 and the frequency of the AC current is set at the magnetic resonance frequency of the free layer. The transistor 420 supplies a DC writing current $I_{DC}$ to the MTJ 100 and produces a torque on the free layer via the spin transfer effect. In the illustrated example, a single MTJ cell 410 is shown to be connected to the bit line 330. In various implementations, the bit line 330 may be connected to supply the same AC current to multiple MTJ cells and thus is shared by such multiple MTJ cells as illustrated in the examples in FIGS. 6 and 7.

The joined operation of the AC writing current $i_{AC}$ and the DC writing current $I_{DC}$ collectively switches the free layer in the MTJ 100. In such a switching operation, a particular MTJ cell within a MRAM array can be selected and switched while leaving other cells unaffected. This joined operation by spin transfer via a DC current and magnetic torque by an AC current may be understood as follows. During spin-transfer induced switching, the magnetization of the free layer precesses around the direction of the magnetization stability of the MTJ. This precession is caused by the spin-torque imparted by the spin-polarized DC current bringing the magnetization of the free layer out of the equilibrium. The direction of the spin torque is defined by $\vec{M} \times (\vec{M} \times \vec{M}_p)$, where $\vec{M}_p$ is the magnetization direction of the pinned layer. The spin-torque is countered by the damping of the free layer and this damping operates to bring the magnetization vector back to equilibrium.

The applied oscillating magnetic field is controlled to be at the resonant frequency of the magnetization of the free layer and its direction is directed in the direction of the hard axis of the free layer. This applied oscillating magnetic field operates to impart a torque on the magnetization vector in the direction defined by the cross-product of $\vec{M} \times \vec{H}$. A corresponding torque generated by an oscillating resonant magnetic field and spin-transfer can add, allowing for each of these two mechanisms to act as a half-select process so that each mechanism only contributes to part of the magnetic torque for the switching and cannot cause the switching without the other. Therefore, only when both mechanisms are present at the same time and operate jointly, can the complete switching of the free layer be achieved. In order to effectively couple the oscillating magnetic field caused by the AC current to the magnetic free layer of the MTC, the frequency of the field and the precessional frequency of the free layer must match under a resonance condition during switching. Depending on the MTJ configurations,. the resonance frequencies for the free layer in MTJs may range from several GHz to tens of GHz. For example, some MTJs have resonances approximately between 4 GHz to 8 GHz and others have resonances approximately between 5 GHz to 25 GHz. Other MTJ resonance frequencies can also be achieved.

In practical devices, various factors may affect the above resonance condition. For example, the frequency of the precession can change or shift slightly during switching as the amplitude of the magnetization vector oscillation, as measured from the easy axis, increases. Therefore, in order to maintain sufficient coupling, the frequency bandwidth of the oscillating magnetic field may be made to be sufficiently large to cover the range of this shift in order to maintain the frequency resonance in presence of the frequency shift. The quality factor for the ferromagnetic resonance between the magnetization of the free layer and the applied AC magnetic field may be set to be greater than one. Alternatively, the frequency of the oscillating magnetic field may be controlled to shift or change with the frequency shift to maintain the frequency resonance during switching. The AC source for generating the AC writing current may be a tunable AC source and can be tuned in response to a control signal. Devolder has found a linewidth of 0.2 GHz from noise measurements within spin valves with current induced instabilities. See, T. Devolder et al. Phys Rev B. 71 184401 (2005). The above two implementations are designed to maintain a resonance between the applied oscillating magnetic field and the precessional frequency of the free layer of the MTJ. Due to linewidths and frequency drifting, the center frequency of the applied oscillating magnetic field and the center precessional frequency of the free layer of the MTJ may not necessarily match under this resonance condition but may be sufficiently close to each other, e.g., within each other's spectral linewidth so that the resultant ferromagnetic resonance has a sufficient quality factor, e.g., greater than one, to make the resonance sufficient for the switching based on the combined operation of torques exerted on the free layer by the AC field and the DC current.

Various techniques may be used to generate the AC fields necessary for the resonance condition. Integration of a high frequency signal generator into circuitry is an active area of study for its use in wireless and optical communication applications and other uses. For example, ring-oscillators having a few stages have the potential to provide frequencies in the desired ranges for various applications. These devices tend to occupy a small area on the chip, and do not require large inductors or external components. Such a ring oscillator may be used to as the AC source 430 in the memory device 400 in FIG. 4. Other techniques for creating the appropriate oscillation frequency include micro-electromechanical systems (MEMS) [B. P. Otis and J. M Rabaey. IEEE J. Solid State Circuits. 38. 1271. (2003)], and magnetic oscillation device based on spin transfer [W. H. Rippard et al. Phys. Rev. Lett. 92. 027101. (2004)]. With the proper designs, the additional area added by the AC circuit 430 in FIG. 4 can be small compared to the array size because a small number of AC signals can be distributed to the entire array.

In the device in FIG. 4 and other examples based on the joined switching operation, writing in each cell occurs by simultaneously applying the resonant AC field and spin-transfer torque via the DC current. When the isolation/write transistor 420 is turned on, a spin polarized current $I_{DC}$ runs vertically through the device cell 410. This provides one half-selection. The other half selection comes from the AC current $i_{AC}$ running through the bit line 330 which is near the free layer of the MTJ 100. The applied AC current $i_{AC}$ creates an oscillating magnetic field which couples to the free magnetic layer. The simultaneous application of these currents $i_{AC}$ and $I_{DC}$ causes the free layer to undergo a precessional switching. In one implementation, the potentials at the AC source and the DC source are kept the same so that a DC current runs through the device cell 410 in a given direction. In general, the potentials of the AC source and the DC source are biased relative to each other to eliminate a DC contribution from the AC signal source to the total DC current flowing across the magnetic tunnel junction of the memory cell. To switch the magnetic tunnel junction 100 in the opposite direction, the voltage of the sources and drain of the transistor 420 are reversed. Reading the MTJ 100 can be achieved by passing a small DC current through the MTJ 100 and the impedance is compared to the impedance of a standard for that array [Durlam et al. VLSI Symposium 2002]. Certain configurations of these implementations can be used to achieve one or more advantages, including a high areal storage density, good cell selectivity with minimum cross talk between adjacent cells, reduced power usage, and reliability.

The MRAM cell 410 in FIG. 4 is an example of one type of MRAM cells in a 1T1MTJ design where there is a single transistor 420 per one MTJ 100 based on the combination of the resonant AC current and the spin transfer. Only one element of an array is illustrated. Each row of cells is connected by the common bit line 330 for that row without a word line 440 to address each individual cell. In the 1T1MTJ design writing occurs when a row of bits are selected by the AC magnetic field and the selection transistor 420 for that bit is active. The combined effect of the spin transfer torque and the resonant AC magnetic field is sufficient to change the magnetization direction of the free layer. This architecture can achieve a denser areal storage density than a MRAM array based on spin-transfer only because the write/isolation transistor 420 can be smaller since each transistor 420 is not required to source as much the DC current as in the transistor 320 in FIG. 3 for a field-switched cell 310.

In the design shown in FIG. 4, only a single direction in the memory cell array is physically sensitive to spacing on the wafer. Therefore, the bit-to-bit distance can be different and vary along different axes of the array. This also allows for the separation of the bits in a single direction (the direction parallel to the AC write line) and thus minimizes the field-induced cross talk while keeping the overall density of the array constant. Therefore, the cell densities along the two orthogonal directions of the cell array, the column and the row, can be different. In addition, two or more MTJs can be connected in series to a common DC write transistor and perpendicular to the wafer plane allowing for a vertically stacked MRAM. The above design as shown in FIG. 4 can be extended to designs with a single transistor for controlling two or more MTJs to achieve a higher areal density of the memory array.

Under the resonance condition, the frequency of the oscillating field matches the precessional frequency of the free-layer and the electrical power of the AC current is transferred into the magnetization vector of the cell. In addition, both mechanisms are precessional in nature and can coherently add with each other. The switching of the magnetization of nanoparticles with a resonant RF field has been reported. See, C. Thirion, W Wernsdorfer, and D Mailly. Nature Materials, 2, 524 (2003). In this work, a switching field of 100 mT was found for an RF field at 4.4 Ghz of a few mT and represents a reduction of about 10 fold in the magnitude of the switching field. This result illustrates the potential efficiency of a resonant selection mechanism.

To estimate the magnitude of the field needed for resonant switching, a comparison may be made with the effective field needed for a spin-transfer. An estimate of the effective field produced by the spin transfer torque can be found using following equation:

$$\frac{\partial m}{\partial t} \propto \frac{\gamma}{\mu_0 M_s} \left[ \eta \frac{\hbar J}{e\, d} \right] \vec{M} \times (\vec{M} \times \vec{M}_p)$$

Recognizing that torque can also be written as $$\frac{\partial m}{\partial t} \propto \gamma (\vec{M}_s \times \vec{H})$$

Therefore, assuming a constant current, the effective field for spin torque is:

$$H_{\mathit{eff}} = \frac{\eta}{\mu_o M_s} \frac{\hbar J}{e\, d}$$

As an example, for a free layer with a magnetization of $1*10^6$ A/m (1050 emu/cm$^3$) the effective field is 1030 A/m or approximately 13 Oe.

The use of two different selection mechanisms based on an external resonant AC field and the internal DC current changes the so-called half-select problem. There are now four kinds of selected bits present during writing: (1) bits selected with both the AC writing field and DC writing current, (2) bits selected only with the AC field, (3) bits selected only with the DC current and (4) bits that are selected by neither the AC field nor the DC writing current but are nearest neighbor to the current line, where magnetic cross talk is possible. The nearest neighbor problem can be minimized by separating the bits in a single direction parallel to the AC write line to minimize the field-induced cross-talk while keeping the overall density of the array constant.

Bits selected only with the DC current are kept below the switching threshold for the write distribution. The probability of a bit switching at a given DC current with a zero net magnetic field can be determined by the following equation:

$$P\!\left(\frac{I}{I_0}\right) = \Delta \frac{t_p}{t_0 \exp\!\left(\Delta\!\left(1-\frac{I}{I_0}\right)\right)} \exp\!\left(\frac{-t_p}{t_0 \exp\!\left(\Delta\!\left(1-\frac{I}{I_0}\right)\right)}\right)$$

where $t_p$ is the pulse time, $I_0$ is the critical current, $t_0$ is the attempt frequency and $\Delta$ is the thermal factor. The width of this distribution is highly dependant on the thermal factor $\Delta$. A thermal factor $\Delta$ required for non-volatile memory storage can cause the probably distribution function to have an estimated standard deviation, sigma ($\sigma$), of about 4%. Therefore, keeping the bit 28% below the center of the distribution gives $7\sigma$ process window. This imposes an upper bound on the DC current needed for switching to prevent half-select switching and a lower bound on the resonant AC current needed to supply sufficient resonant field which is estimated to be about 50% of the effective switching field which is approximately is 6.5 Oe. This field requires a resonant AC current of less than $5\times10^6$ A/cm$^2$ assuming a 50 nm separation between the bit and the write lines. This current is small compared to the current in a typical field-switched MRAM cell operated under a DC current. The low power of the AC resonance field makes this switching an attractive alternative.

Figure 5:
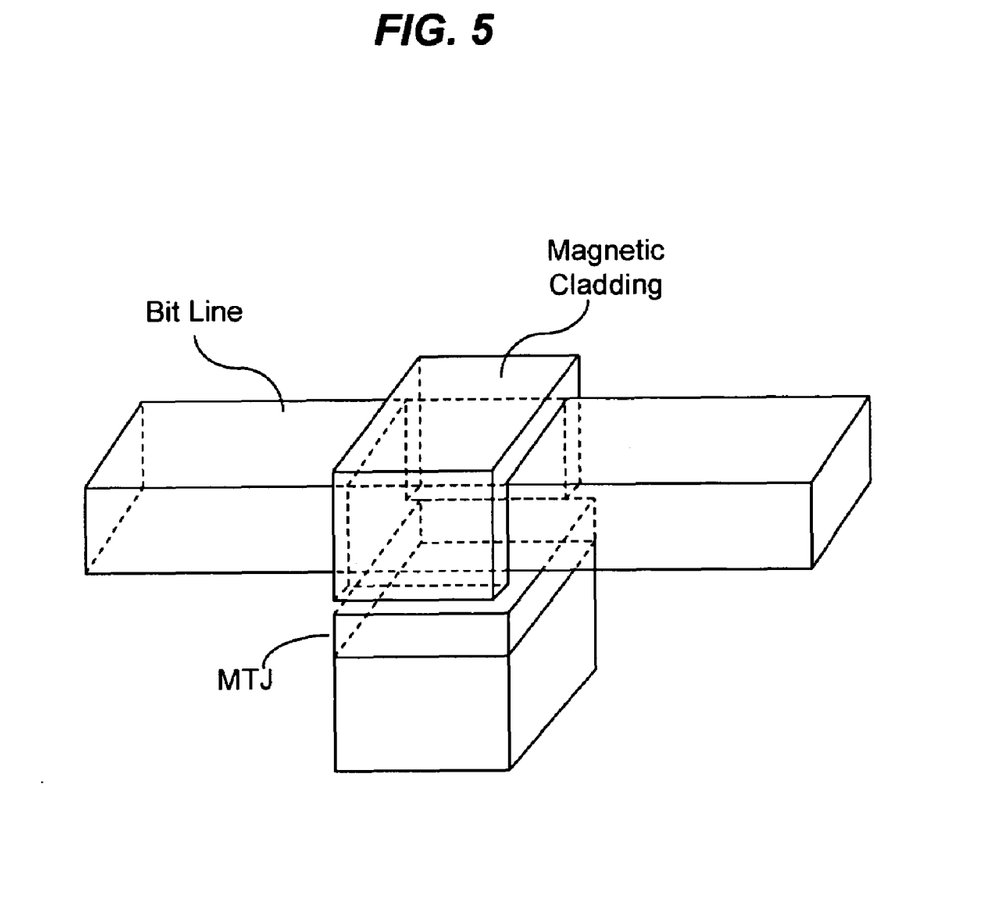
FIG. 5 shows one example for a magnetic flux cladding used in a MTJ cell.

In addition, a magnetic flux cladding can be used to increase the magnetic field locally around a bit to further reduce the required power of the oscillating magnetic field for the switching operation. A magnetic flux concentrator, made of a material with a high permeability and a low magnetic coercivity, may be used as such as magnetic flux cladding. U.S. Pat. No. 6,211,090 describes examples of flux concentrators and is incorporated by reference in its entirety as part of this application. FIG. 5 illustrates one exemplary implementation where a magnetic, cladding is wrapped around the bit line that carries the AC current $i_{AC}$ and has an opening at the MTJ cell to concentrate the magnetic field generated by the AC current at the MTJ cell. Other flux cladding designs may also be used.

A MTJ cell designed to with one or more above features to reduce the operating power allows less power to be dissipated through the MTJ. This condition improves the reliability of the device because the MTJ cells are activated further away from the dielectric breakdown condition.

The ferromagnetic resonant frequency of the free layer in the MTJ can be estimated for an elliptical magnetic element with lateral dimensions of 100 nm by 180 nm and a thickness of 2.2 nm. Assume the magnetization of the magnetic element is 1050 emu/cc. Using Sharrock's formula, this cell has a $K_u V/k_B T$ of about 60 and thus is thermally stable for MRAM applications. The cell's $H_k$ is about 170 Oe. See, M. P. Sharrock and J. T. McKinney IEEE Trans. Mag. 6 3020 (1981). The ferromagnetic resonant frequency is estimated using the formula $$f_{FMR} = \frac{\gamma}{2\pi} \sqrt{4\pi M H_k}$$

where $\gamma$ is the gryomagnetic ratio. Accordingly, the ferromagnetic resonance frequency in the absence of an external magnetic field is approximately 4.2 Ghz. This is of the same order of magnitude as the precessional related noise seen in unstable magnetic tunnel junctions. In one publication by Devolder et al. in Phys Rev B. 71 184401 (2005), it is reported that the noise spectrum of the current for the MTJ was measured above the instability threshold. Above the instability threshold but below the switching threshold, it was found that a significant noise peak appeared around 8.3 GHz. This is due to the precessional nature of switching. The spin transfer torque is found to only have a small influence on the resonant frequency. In this regard, other studies have predicted that the effect of the spin current on FMR is to change the resonance amplitude and linewidth, which is the effect needed to make the AC field a half-select mechanism with spin transfer. See, H. Xi, Y Shi and K-Z Gao. J. Appl. Phys. 97 033904 (2005).

In the implementations described here, as the bit size continues to decrease for smaller bit sizes and higher areal storage densities, the free layer acts more like a single spin particle to a certain extent. This can reduce the non-linear effects due to the end domains and should narrow the resonance linewidth.

In the example shown in FIG. 4, each MTJ cell 410 includes one write transistor 420 which controls the MTJ 100. The simultaneous use of the resonant AC writing current and spin transfer caused by the DC current allows for a reduced DC current and thus a smaller transistor size and reduced interference between adjacent cells. The simultaneous use of the resonant AC writing current and spin transfer caused by the DC current may also be implemented to connect to a number of MTJ cells a single write transistor so that these MTJ cells share the same transistor and are controlled by this shared transistor. For example, the selection of the single write transistor, allowing current to pass through a number of MTJs connected in series, allows for the selection of a column of bits. The row of bit is selected by the AC magnetic field from the AC current running through the bit line. The effective field from contributions from the spin polarized DC current and the AC magnetic field is sufficient only where the contributions can add together, at the intersection of the column of activated bits through spin transfer and row of AC field selected bits. This architecture for using a single write transistor to control two or more MTJ cells may be implemented in different configurations.

Figure 6:
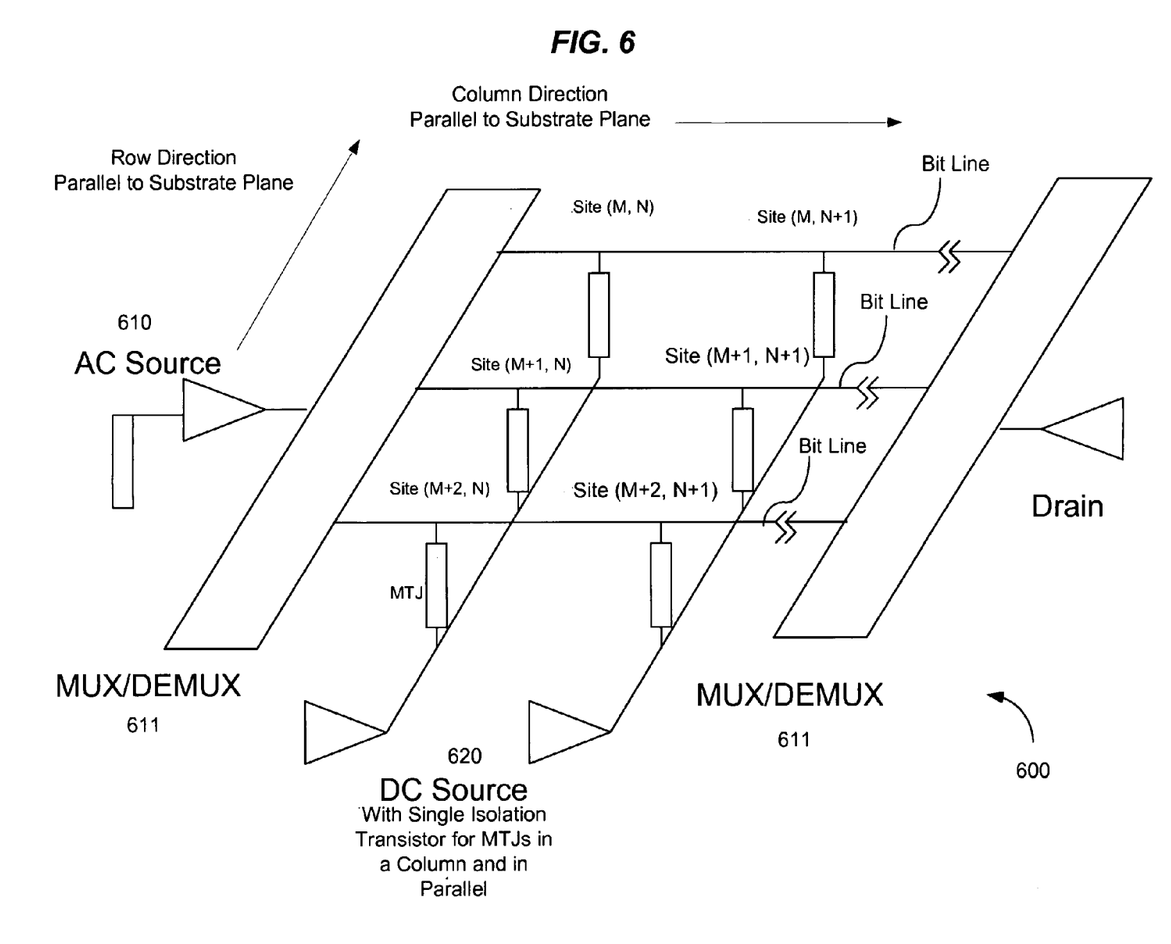
FIG. 6 shows the RF assisted spin transfer switching with a number of bits connected in parallel.

FIG. 6 shows one example 600 where different MTJ cells are spatially separated from one another along a horizontal direction that is parallel to the substrate on which the MTJ cells are fabricated. The exemplary MTJ cells are labeled as Site (M, N), Site (M+1, N), Site (M+2, N), Site (M, N+1), Site (M+1, N+1), and Site (M+2, N+1). In this configuration, the wafer surface is horizontally divided into an array of memory sites in rows and columns and each memory site has only one MTJ cell. Each column of MTJ cells is connected to a common DC source and a single column isolation transistor. These MTJ cells in a column are electrically parallel to one another. Hence, the single column isolation transistor can be controlled to select or unselect all MTJ cells connected to the same column write line. A single AC source 610 and a corresponding drain may be used to supply the AC current to the entire array. A signal multiplexer/demultiplexer 611 is used to apply the AC current to one or more selected rows, e.g., the row bit lines. All MTJ cells in one column share a single DC source 620 with a single isolation transistor. Different MTJ cells are electrically connected in parallel to the DC source and the shared single isolation transistor. A selection of an MTJ occurs when both the AC current in the bit line and the DC current in the column line are turned on at the same time.

Figure 7:
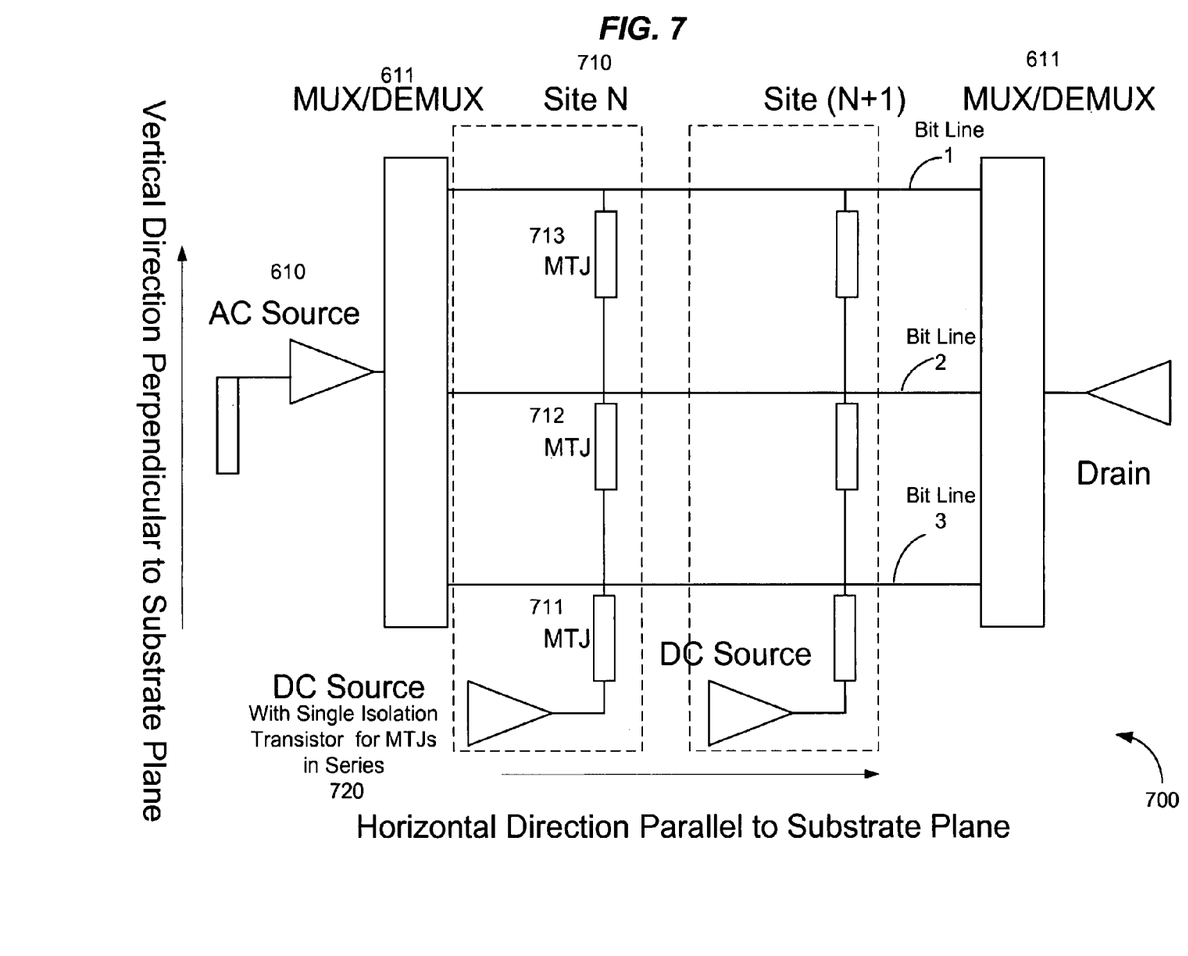
FIG. 7 shows the RF assisted spin transfer switching with three bits connected in series in the vertical configuration.

FIG. 7 shows another example 700 of an MRAM array device where the wafer surface is horizontally divided into array of memory sites in rows and columns as the design in FIG. 6 but each site has two or more MTJ cells that are stacked along the vertical direction perpendicular to the plane of the substrate and are electrically connected in series. The stacked MTJs connected in series may be made by, for example, fabricating two or mote of the stack of the MTJ layers 110, 130 and 120 shown in FIG. 1 at the same site. U.S. Pat. No. 6,829,161 describes specific examples of stacked MTJs and is incorporated by reference in its entirety as part of this application. As illustrated in FIG. 7, a site 710 at site N on the wafer is fabricated with three stacked MTJs 711, 712 and 713. An adjacent site (N+1) is also shown. All MTJs electrically connected in series at one site are controlled by a DC source 720 with a single isolation transistor. Different sites have different isolation transistors. Alternatively, different sites in the same column may share a single isolation transistor in an arrangement similar to FIG. 6 except that each site now has two or more stacked MTJs connected in series. Notably in FIG. 7, different MTJs at a single site are respectively activated by their designated bit lines, e.g., bit lines 1, 2 and 3 at different layers as shown. The layer structure in each site is designed so that a bit line is closer to its designated MTJ cell and is sufficiently spaced from other MTJs at the same site to reduce the cross talk of different MTJs at the same site. Only two sites in a single row are shown in FIG. 7. A single AC source 610 and a corresponding drain may be used to supply the AC current to the device 700 and a signal mux/demux 611 is used to select and activate one or more bit lines to apply the AC current.

In both examples shown in FIGS. 6 and 7, the AC field passes close to the magnetic bits and provides the half-selection and the spin-transfer provides the other half-selection. The vertical structure in FIG. 7 has a higher effective density since multiple bits are stored in the area of a single transistor. This area is determined by the current that the transistor is required to source. For example, a transistor sourcing 200 uA can take up about $33F^2$ assuming that transistors at the 90 nm technology node can source 500 uA/um width. A 1.2 volt drop across the memory stack give a total resistance of 6 kOhm. Allowing 2 kOhm for the transistor and lead resistance, then four 1 kOhm MTJs can be stacked giving an effect area of ~$8F^2$/bit.

Only a few implementations are disclosed. Variations and enhancements may be made.

What is claimed is:
1. A magnetic memory device, comprising:
   a memory cell comprising a magnetic tunnel junction which comprises a free magnetic layer, a pinned magnetic layer and a spacer layer which is nonmagnetic and located between the pinned magnetic layer and the free magnetic layer;
   a first mechanism to apply an AC current to produce an oscillating magnetic field at an oscillating frequency in resonance with a magnetic resonance frequency of the free magnetic layer and to magnetically couple the oscillating magnetic field to the free magnetic layer; and
   a second mechanism to apply a DC current across the magnetic tunnel junction of the memory cell to cause a spin transfer torque in the free magnetic layer,
   wherein a magnitude of each of the oscillating magnetic field by the AC current and the spin transfer torque by the DC current alone and without the other is less than a threshold for changing a magnetization direction of the free magnetic layer.

2. The device as in claim 1, wherein the oscillating magnetic field by the AC current and the spin transfer torque by the DC current in combination exceed the threshold and thus change the magnetization direction of the free magnetic layer when the AC current and the DC current are applied to the memory cell at the same time.

3. The device as in claim 1, wherein the first mechanism to apply the AC current comprises an AC signal source electrically coupled to the magnetic tunnel junction of the memory cell and the second mechanism to apply the DC current comprises a DC signal source electrically coupled to the magnetic tunnel junction of the memory cell, and wherein the AC signal source is electrically biased relative to the DC signal source to substantially eliminate a DC contribution from the AC signal source to a total DC current flowing across the magnetic tunnel junction of the memory cell.

4. The device as in claim 1, wherein the second mechanism to apply the DC current comprises a transistor electrically coupled to the memory cell to control the DC current flowing across the magnetic tunnel junction of the memory cell.

5. The device as in claim 4, further comprising at least a second memory cell comprising a magnetic tunnel junction which comprises a free magnetic layer, a pinned magnetic layer and a spacer layer which is nonmagnetic and located between the pinned magnetic layer and the free magnetic layer,
wherein the memory cell and the second memory cell are electrically connected in series and are connected to the transistor which controls the DC current through both the memory cell and the second memory cell.

6. The device as in claim 4, further comprising at least a second memory cell comprising a magnetic tunnel junction which comprises a free magnetic layer, a pinned magnetic layer and a spacer layer which is nonmagnetic and located between the pinned magnetic layer and the free magnetic layer,
wherein the memory cell and the second memory cell are electrically connected in parallel and are connected to the transistor which controls the DC current through both the memory cell and the second memory cell.

7. The device as in claim 1, further comprising:
a substrate having a location on which the memory cell is formed; and
at least a second memory cell formed at the location and stacked over the memory cell,
wherein the first mechanism is configured to apply the AC current to select one of the memory cell and the second memory cell at the location.

8. The device as in claim 7, wherein the second mechanism comprises a transistor connected to supply the DC current to both the memory cell and the second memory cell.

9. The device as in claim 1, wherein the first mechanism comprises a tuning mechanism to tune the oscillating frequency of the oscillating magnetic field to maintain the resonance of the oscillating magnetic field with the magnetic resonance frequency of the free magnetic layer.

10. The device as in claim 1, wherein the first mechanism is configured to make a linewidth of the oscillating magnetic field cover a frequency range within which the magnetic resonance frequency of the free magnetic layer varies to maintain the resonance of the oscillating magnetic field with the magnetic resonance frequency of the free magnetic layer in presence of a variation in the magnetic resonance frequency of the free magnetic layer.

11. The device as in claim 1, further comprising a magnetic flux cladding device to concentrate the oscillating magnetic field at the free layer of the memory cell.

12. The device as in claim 1, wherein the first mechanism is configured to apply the oscillating magnetic field along a hard axis of the free magnetic layer.

13. The device as in claim 1, wherein the first mechanism comprises an AC source to produce the AC current and a first conductor line to direct the AC current near the memory cell, and wherein the second mechanism comprises a second conductor line to supply the DC current to the memory cell and a transistor connected in the second conductor line to control the DC current.

14. The device as in claim 13, wherein the transistor and the magnetic tunnel junction are inside the memory cell.

15. The device as in claim 13, further comprising at least a second memory cell to share the first conductor line with the memory cell, wherein the second mechanism further comprises a third conductor line to supply a DC current to the second memory cell and a second transistor connected in the third conductor line to control the DC current through the second memory cell.

16. A method for operating a memory cell comprising a magnetic tunnel junction, comprising:
applying an AC current to produce an oscillating field at an oscillating frequency and in resonance with a magnetic resonance frequency of a free magnetic layer of the magnetic tunnel junction and to magnetically couple the oscillating field to the free magnetic layer;
applying a DC current across the magnetic tunnel junction to cause a spin transfer torque in the free magnetic layer; and
controlling the AC and DC currents to be applied simultaneously to switch a magnetic orientation of the free magnetic layer.

17. The method as in claim 16, wherein a magnitude of each of the oscillating magnetic field by the AC current and the spin transfer torque by the DC current alone and without the other is less than a threshold for changing a magnetization direction of the free magnetic layer.

18. The method as in claim 16, further comprising tuning the oscillating frequency of the oscillating magnetic field to maintain the resonance of the oscillating magnetic field with the magnetic resonance frequency of the free magnetic layer.

19. The method as in claim 16, further comprising making a linewidth of the oscillating magnetic field to cover a frequency range within which the magnetic resonance frequency of the free magnetic layer varies to maintain the resonance of the oscillating magnetic field with the magnetic resonance frequency of the free magnetic layer in presence of a variation in the magnetic resonance frequency of the free magnetic layer.

20. The method as in claim 16, further comprising spatially confining the oscillating magnetic field to concentrate the oscillating magnetic field at the free layer of the memory cell.

21. The method as in claim 13, further comprising applying the oscillating magnetic field along a hard axis of the free magnetic layer.

22. A magnetic memory device, comprising:
a substrate;
a plurality of memory cells at different locations on the substrate and arranged in rows and columns, each memory cell comprising a magnetic tunnel junction which comprises a free magnetic layer, a pinned magnetic layer and a spacer layer which is nonmagnetic and located between the pinned magnetic layer and the free magnetic layer;

an AC signal source to produce an AC current at an oscillating frequency in resonance with a magnetic resonance frequency of the free magnetic layer;

a plurality of first conductor lines coupled to different rows of memory cells, respectively, each first conductor line electrically coupled to a corresponding row of memory cells and coupled to receive the AC current and to magnetically couple the oscillating magnetic field to the free magnetic layer of each memory cell of the corresponding row;

a plurality of second conductor lines coupled to different columns of memory cells, respectively, each second conductor line electrically coupled to supply a DC current to a corresponding column of memory cells wherein the DC current flows across the magnetic tunnel junction of each memory cell to cause a spin transfer torque in the free magnetic layer, wherein a magnitude of each of the oscillating magnetic field by the AC current and the spin transfer torque by the DC current alone and without the other is less than a threshold for changing a magnetization direction of the free magnetic layer of each memory cell, and wherein the oscillating magnetic field by the AC current and the spin transfer torque by the DC current in combination exceed the threshold and thus change the magnetization direction of the free magnetic layer when the AC current and the DC current are applied to the memory cell at the same time, and a control mechanism to control application of the AC current and the DC current to select one or more memory cells to switch.

23. The device as in claim 22, further comprising a plurality of column transistors respectively coupled to the second conductor lines, each column transistor coupled to control and supply the DC current to a designated column of memory cells.

* * * * *